US009972519B2

(12) United States Patent
Yuk et al.

(10) Patent No.: US 9,972,519 B2
(45) Date of Patent: May 15, 2018

(54) SUBSTRATE TRANSPORTING APPARATUS AND METHOD OF OPERATING THE SAME

(71) Applicant: SAMSUNG ELECTRONICS CO., LTD., Suwon-si, Gyeonggi-do (KR)

(72) Inventors: Nam-Su Yuk, Suwon-si (KR); Jae-Won Jeong, Hwaseong-si (KR); Ho-Youl Lee, Suwon-si (KR); Ju-No Park, Seoul (KR); Jae-Young Eom, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 592 days.

(21) Appl. No.: 14/596,405

(22) Filed: Jan. 14, 2015

(65) Prior Publication Data
US 2015/0370246 A1 Dec. 24, 2015

(30) Foreign Application Priority Data

Jun. 20, 2014 (KR) .................. 10-2014-0076022

(51) Int. Cl.
| G05B 19/418 | (2006.01) |
| H01L 21/68 | (2006.01) |
| H01L 21/67 | (2006.01) |

(52) U.S. Cl.
CPC ...... *H01L 21/681* (2013.01); *H01L 21/67242* (2013.01); *H01L 21/67259* (2013.01)

(58) Field of Classification Search
CPC ............. H01L 21/67259; H01L 21/681; H01L 21/67242
See application file for complete search history.

(56) References Cited

U.S. PATENT DOCUMENTS

| 7,522,267 B2 | 4/2009 | Hofmeister et al. |
| 7,706,919 B2 | 4/2010 | Adachi et al. |
| 7,933,665 B2 | 4/2011 | Sakiya et al. |
| 2005/0034288 A1* | 2/2005 | Adachi ............. H01L 21/67259 29/25.01 |
| 2006/0192514 A1* | 8/2006 | Adachi ............. H01L 21/67259 318/568.13 |
| 2007/0159609 A1* | 7/2007 | Takaiwa ................. G03B 27/42 355/53 |

(Continued)

FOREIGN PATENT DOCUMENTS

| JP | 2003-203965 A | 7/2003 |
| JP | 2005-123261 A | 5/2005 |

(Continued)

*Primary Examiner* — Abdelmoniem Elamin
(74) *Attorney, Agent, or Firm* — Lee & Morse, P.C.

(57) ABSTRACT

A substrate transporting apparatus includes a first light emitting sensor emitting a first sensing light in a first direction, a first light receiving sensor receiving the first sensing light, a second light emitting sensor emitting a second sensing light in a second direction different than the first direction, a second light receiving sensor receiving the second sensing light, a substrate transporting loader passing through traveling lines of the first sensing light and the second sensing light, a state information storage unit storing state information of the substrate transporting loader, and an operation information computing unit computing operation information of the substrate transporting loader based on the state information.

18 Claims, 17 Drawing Sheets

(56) References Cited

U.S. PATENT DOCUMENTS

| | | | | |
|---|---|---|---|---|
| 2009/0198377 A1* | 8/2009 | Adachi | ............... | H01L 21/681 |
| | | | | 700/250 |
| 2011/0130864 A1 | 6/2011 | Hirota | | |
| 2013/0293855 A1* | 11/2013 | Takaiwa | ............... | G03B 27/42 |
| | | | | 355/30 |
| 2014/0313554 A1* | 10/2014 | Osakabe | ............ | H04N 1/00681 |
| | | | | 358/498 |

FOREIGN PATENT DOCUMENTS

| | | |
|---|---|---|
| JP | 2006-332543 A | 12/2006 |
| JP | 2009-166163 A | 7/2009 |
| JP | 2012-121680 A | 6/2012 |
| JP | 2013-149902 A | 8/2013 |
| JP | 2013-153187 A | 8/2013 |
| KR | 10-2004-0044860 A | 5/2004 |
| KR | 10-2006-0057222 A | 5/2006 |
| KR | 10-2006-0126627 A | 12/2006 |
| KR | 10-2009-0045504 A | 5/2009 |
| KR | 10-2012-0077881 A | 7/2012 |
| KR | 10-2012-0139057 A | 12/2012 |
| KR | 10-2013-0037355 A | 4/2013 |
| KR | 10-2013-0125158 A | 11/2013 |
| WO | WO 2003/101677 A1 | 12/2003 |

\* cited by examiner

SUBSTRATE TRANSPORTING APPARATUS AND METHOD OF OPERATING THE SAME

CROSS-REFERENCE TO RELATED APPLICATION

This application claims priority from Korean Patent Application No. 10-2014-0076022 filed on Jun. 20, 2014 in the Korean Intellectual Property Office, and all the benefits accruing therefrom under 35 U.S.C. 119, the contents of which in its entirety are herein incorporated by reference.

BACKGROUND

1. Field

Embodiments relate to a substrate transporting apparatus and a method of operating the same.

2. Description of the Related Art

Along with the development of the information society, there is an increasing demand in various forms for a display device for displaying an image. Various flat display devices such as a liquid crystal display (LCD), a plasma display panel (PDP), an organic light emitting diode (OLED) display have been used.

The flat display device is manufactured by repeatedly performing manufacturing steps of thin film deposition, etching, cleaning and the like to form a plurality of thin films on a substrate. In the manufacturing steps, the substrate on which the previous step has been performed is loaded in a cassette and transported. Then, the substrate is unloaded from the cassette to perform the next step.

A substrate transporting apparatus used for transporting the substrate includes a transport robot having a robot hand. The robot hand enters a space below the substrate and allows the substrate to be seated on the upper surface thereof. Then, the robot hand unloads the substrate from the cassette.

SUMMARY

Aspects of embodiments provide a substrate transporting apparatus enabling automatic teaching of a transport robot, thereby eliminating a teaching error which may be caused by a user, shortening the teaching time, and reducing costs which may be incurred due to re-teaching.

Aspects of embodiments also provide a method of operating a substrate transporting apparatus enabling automatic teaching of a transport robot, thereby eliminating a teaching error which may be caused by a user, shortening the teaching time, and reducing costs which may be incurred due to re-teaching.

According to embodiments, there is provided a substrate transporting apparatus including a first light emitting sensor to emit a first sensing light in a first direction, a first light receiving sensor to receive the first sensing light, a second light emitting sensor to emit a second sensing light in a second direction different from the first direction, a second light receiving sensor to receive the second sensing light, a substrate transporting loader to pass through traveling lines of the first sensing light and the second sensing light, a state information storage unit to store state information of the substrate transporting loader, and an operation information computing unit to compute operation information of the substrate transporting loader based on the state information.

According to other embodiments, there is provided a substrate transporting apparatus including first and second transmission type optical sensors, a frame on which the first and second transmission type optical sensors are arranged, and a substrate transporting loader located in a sensing region of the first and second transmission type optical sensors, wherein the first and second transmission type optical sensors obtain position information and inclination information of the substrate transporting loader by using only first and second sensing lights.

According to an embodiment, a method of operating a substrate transporting apparatus, the method comprising emitting a first sensing light in a first direction using a first light emitting sensor, receiving the first sensing light through a first light receiving sensor, emitting a second sensing light in a second direction different than the first direction using a second light emitting sensor, receiving the second sensing light through a second light receiving sensor, passing through traveling lines of the first sensing light and the second sensing light using a substrate transporting loader, storing state information of the substrate transporting loader using a state information storage unit, computing operation information of the substrate transporting loader based on the state information using an operation information computing unit, and performing a transporting operation to a target position.

The method may further comprise controlling an operation of the substrate transporting loader based on the operation information using an operation controller.

A frame may be provided and the first and second light emitting sensors and the first and second light receiving sensors are arranged on the frame.

The frame may be a rectangular shape, and the first and second light emitting sensors and the first and second light receiving sensors are arranged on different surfaces of the frame, respectively.

The first light emitting sensor and the first light receiving sensor can be arranged on surfaces facing each other, and the second light emitting sensor and the second light receiving sensor can be arranged on surfaces facing each other.

BRIEF DESCRIPTION OF THE DRAWINGS

The above and other aspects and features will become more apparent by describing in detail exemplary embodiments thereof with reference to the attached drawings, in which.

DETAILED DESCRIPTION

Figure 1:
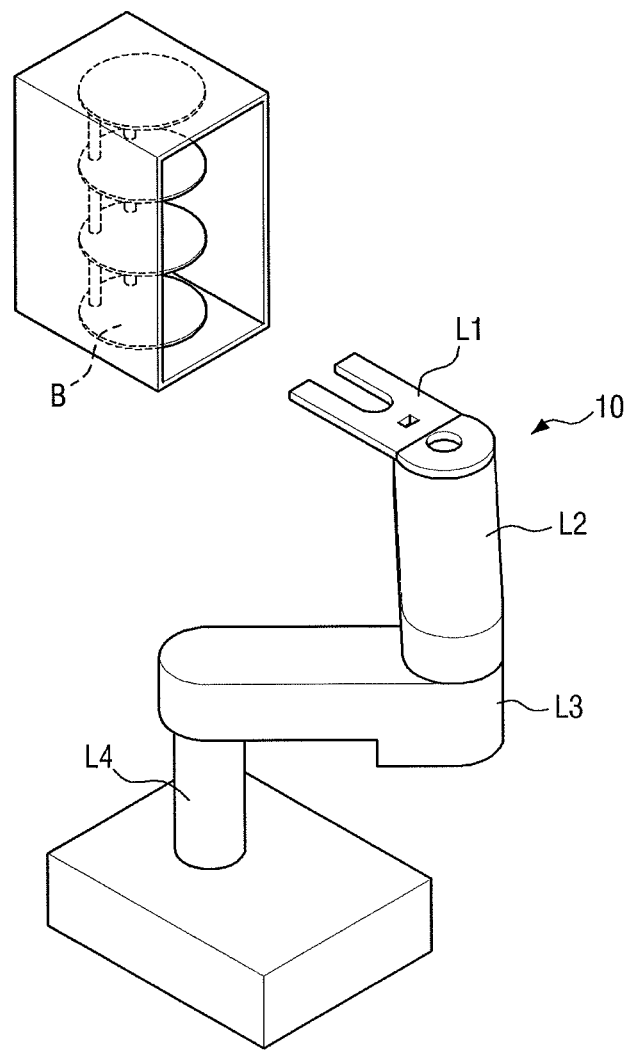
FIG. 1 schematically shows a substrate transporting apparatus according to an embodiment.

Embodiments will now be described more fully hereinafter with reference to the accompanying drawings, in which preferred embodiments are shown. The embodiments may, however, be embodied in different forms and should not be construed as limited to those set forth herein. Rather, these embodiments are provided so that this disclosure will be thorough and complete, and will fully convey the scope to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art. It is noted that the use of any and all examples, or exemplary terms provided herein is intended merely to better illuminate embodiments and is not limiting, unless otherwise specified. Further, unless defined otherwise, all terms defined in generally used dictionaries may not be overly interpreted.

Embodiments will be described with reference to perspective views, cross-sectional views, and/or plan views, in which preferred embodiments are shown. Thus, the profile of an exemplary view may be modified according to manufacturing techniques and/or allowances. That is, the embodiments are not intended to limit but cover all changes and modifications that can be caused due to a change in manufacturing process. Thus, regions shown in the drawings are illustrated in schematic form and the shapes of the regions are presented simply by way of illustration and not as a limitation.

In a substrate transporting apparatus and a method of operating the substrate transporting apparatus, which will be described below, various types of position information and inclination information of a substrate transporting loader are obtained by using sensing lights generated to intersect each other in a cross (+) shape, and the position and the state of the substrate transporting loader are corrected such that the substrate transporting loader can be moved accurately to a target position based on the obtained information.

According to embodiments, two optical sensors, particularly, transmission type optical sensors, each including a light emitting sensor and a light receiving sensor, are used to emit sensing lights that intersect each other in a cross shape.

By using only two transmission type optical sensors, both the position information and the inclination information of the substrate transporting loader can be obtained.

Since the substrate can be transported precisely to a target position, re-teaching is not required, and there are advantages of reducing the time required for transporting the substrate, and eliminating the loss generated when the equipment is stopped.

Figure 2:
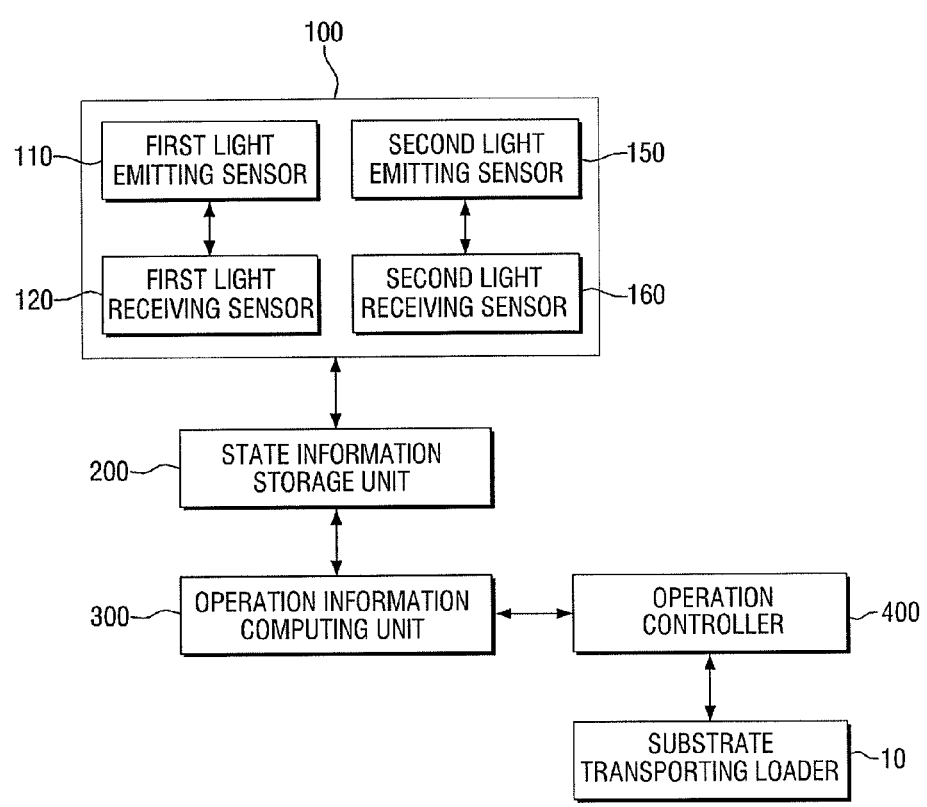
FIG. 2 is a block diagram schematically showing a substrate transporting apparatus according to an embodiment.
Figure 3:
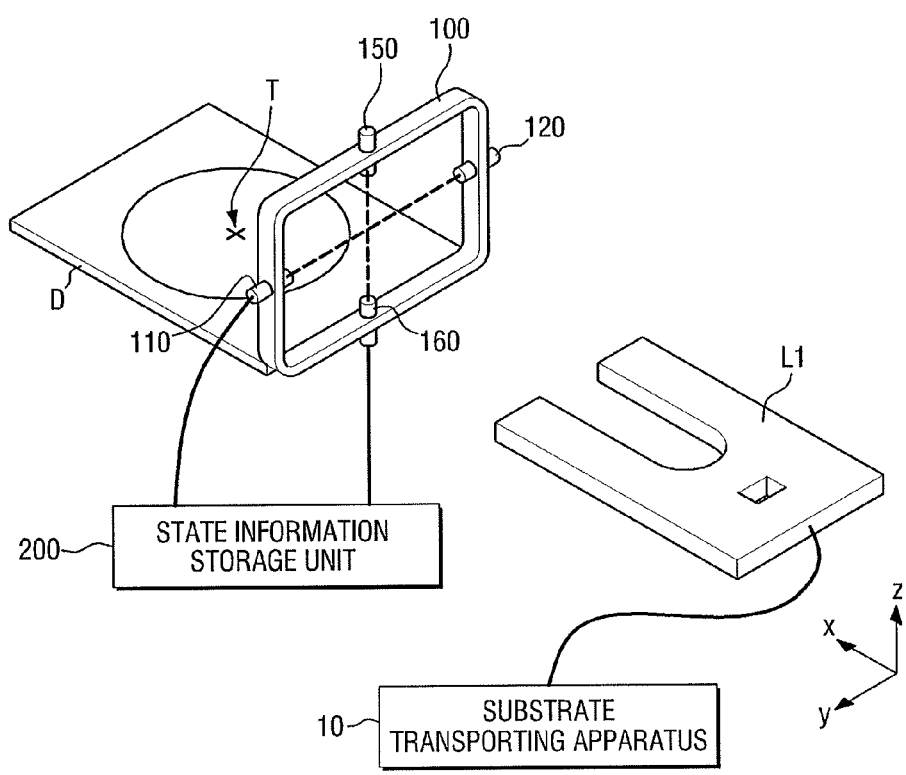
FIG. 3 is a diagram partially showing a substrate transporting apparatus according to an embodiment.
Figure 4:
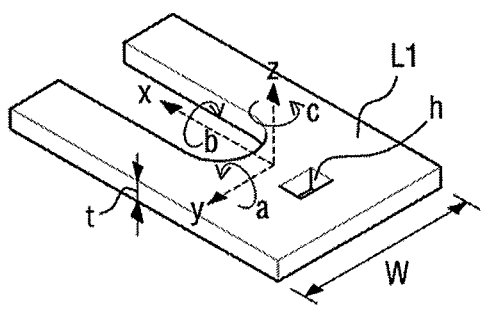
FIG. 4 shows a substrate transporting loader of a substrate transporting apparatus according to an embodiment.

FIG. 1 schematically shows a substrate transporting apparatus according to an embodiment. FIG. 2 is a block diagram schematically showing a substrate transporting apparatus according to an embodiment. FIG. 3 is a diagram partially showing a substrate transporting apparatus according to an embodiment. FIG. 4 shows a substrate transporting loader of a substrate transporting apparatus according to an embodiment.

Referring to FIGS. 1 to 4, a substrate transporting apparatus 10 includes a substrate transporting loader L1, a frame 100, a first light emitting sensor 110, a first light receiving sensor 120, a second light emitting sensor 150, a second light receiving sensor 160, a state information storage unit 200, an operation information computing unit 300, an operation controller 400 and the like.

Referring to FIG. 1, the substrate transporting apparatus 10 may be operated such that a substrate (e.g., wafer) is mounted on the substrate transporting loader L1, and the mounted substrate is loaded on a substrate loading boat B. The substrate transporting apparatus 10 may be operated such that the substrate loaded on the substrate loading boat B is unloaded and transported to a position required for another process.

Although FIG. 1 exemplarily illustrates the substrate loading boat B, embodiments are not limited thereto. The substrate transporting apparatus may be used in various locations where the substrate needs to be loaded to perform a process.

FIG. 1 exemplarily shows a case in which the substrate transporting apparatus includes the substrate transporting loader L1 and a plurality of loaders L2, L3 and L4 for supporting the substrate transporting loader, but embodiments are not limited thereto. The substrate transporting apparatus may have various configurations in which the substrate transporting loader L1 can be moved in an X-axis, Y-axis or Z-axis direction, and the substrate transporting loader L1 can be rotated around an X-axis, Y-axis or Z-axis.

The substrate transporting apparatus shown in FIGS. 1 and 3 is configured such that the substrate transporting loader L1 can be moved in the X-axis and Y-axis directions by rotating the second and third loaders L2 and L3 in a horizontal direction around the Z-axis, and the substrate transporting loader L1 can be moved in the Z-axis direction by vertically moving the fourth loader L4 in the Z-axis direction. The substrate transporting loader L1 may be rotated in the horizontal direction around the Z-axis, may be moved around the X-axis to maintain a horizontal state of the substrate transporting loader L1, and may be moved around the Y-axis to maintain a horizontal state of the substrate transporting loader L1.

Referring to FIGS. 3 and 4, the frame 100 is a frame on which the first light emitting sensor 110, the first light receiving sensor 120, the second light emitting sensor 150 and the second light receiving sensor 160 are arranged. Exemplarily, the frame 100 has a rectangular shape, and the first light emitting sensor 110, the first light receiving sensor 120, the second light emitting sensor 150 and the second light receiving sensor 160 may be arranged on the different surfaces of the frame 100, respectively. That is, the first light emitting sensor 110 and the first light receiving sensor 120 may be arranged on the facing surfaces of the frame 100, and the second light emitting sensor 150 and the second light receiving sensor 160 may be arranged on the facing surfaces of the frame 100.

By this structure, it is possible to maximize a sensing function of the transmission type optical sensors. The arrangement of the optical sensors for forming the maximum sensing region by using the two transmission type optical sensors is as described above.

The first light emitting sensor 110 emits a first sensing light SL1 in a first direction, and the first light receiving sensor 120 receives the first sensing light SL1. The second light emitting sensor 150 emits a second sensing light SL2 in a second direction, and the second light receiving sensor 160 receives the second sensing light SL2. In this case, the second direction means a direction different from the first direction. In the present embodiment, it has been illustrated that the first direction is perpendicular to the second direction.

In an embodiment, the first light emitting sensor 110, the first light receiving sensor 120, the second light emitting sensor 150 and the second light receiving sensor 160 may be arranged such that the first sensing light SL1 travels in the horizontal direction with respect to a reference surface (e.g., upper surface of a substrate loading die D), and the second sensing light SL2 travels in the vertical direction with respect to the reference surface (e.g., upper surface of the substrate loading die D).

The substrate transporting loader L1 passes through the traveling lines of the first sensing light SL1 and the second sensing light SL2 to perform a sensing operation. That is, when the substrate transporting loader L1 enters a sensing region formed by the first sensing light SL1 and the second sensing light SL2, the sense operation is performed, and the position of the substrate transporting loader L1 can be identified by a predetermined orthogonal coordinate system.

The state information storage unit 200 stores state information I_S of the substrate transporting loader L1. That is, the state information I_S about the state of the substrate transporting loader L1 detected by the first light emitting sensor 110, the first light receiving sensor 120, the second light emitting sensor 150 and the second light receiving sensor 160 may be stored in the state information storage unit 200, and may be used when computing operation information I_M about the substrate transporting loader L1. In this case, the state information I_S may include position information I_P or inclination information I_I of the substrate transporting loader L1.

The position information I_P means the position to which the substrate transporting loader L1 is moved in the X-axis, Y-axis and Z-axis directions with respect to a virtual three-dimensional orthogonal coordinate system which has been preset. That is, in order to accurately move the substrate transporting loader L1 to a target position T, it is required to know a relative distance from the current position to the target position T. Accordingly, it is necessary to know the current position of the substrate transporting loader L1, and information on the current position of the substrate transporting loader L1 is the position information I_P.

The inclination information I_I means information on the degree by which the substrate transporting loader L1 is inclined with respect to a virtual horizontal plane or vertical plane. That is, the substrate transporting loader L1 may fail to maintain the horizontal state or vertical state while performing a plurality of operations. Accordingly, the information about the state is used to accurately move the substrate transporting loader L1 to the target position T after correcting the state.

In another meaning, the inclination information I_I may indicate the degree by which the substrate transporting loader L1 is rotated around the axis of the virtual three-dimensional orthogonal coordinate system. If the substrate transporting loader L1 is rotated by a predetermined amount around the X-axis or Y-axis, the horizontal state cannot be maintained, and if the substrate transporting loader L1 is rotated by a predetermined amount around the Z-axis, the vertical state cannot be maintained.

The operation information computing unit 300 computes the operation information I_M of the substrate transporting loader L1 based on the state information I_S. The operation information I_M is information necessary to move the substrate transporting loader L1 to the target position T. The distances by which the first light emitting sensor 110, the first light receiving sensor 120, the second light emitting sensor 150 and the second light receiving sensor 160 are spaced apart from the target position T are preset. Thus, it is possible to compute the operation information I_M using this information and the position information I_P about the substrate transporting loader L1.

The operation controller 400 controls the operation of the substrate transporting loader L1 based on the operation information I_M. That is, it is possible to move or rotate the substrate transporting loader L1 according to the operation information I_M.

In an embodiment, a sensing groove h may be formed in the substrate transporting loader L1. The position of the sensing groove h may be sensed by the second light emitting sensor 150 and the second light receiving sensor 160 to obtain the position information I_P of the substrate transporting loader L1. However, embodiments are not limited thereto, and the sensing groove h may not be formed.

FIGS. 5 to 13 are diagrams for explaining the correction of the state of a substrate transporting loader of a substrate transporting apparatus according to an embodiment.

Figure 5:
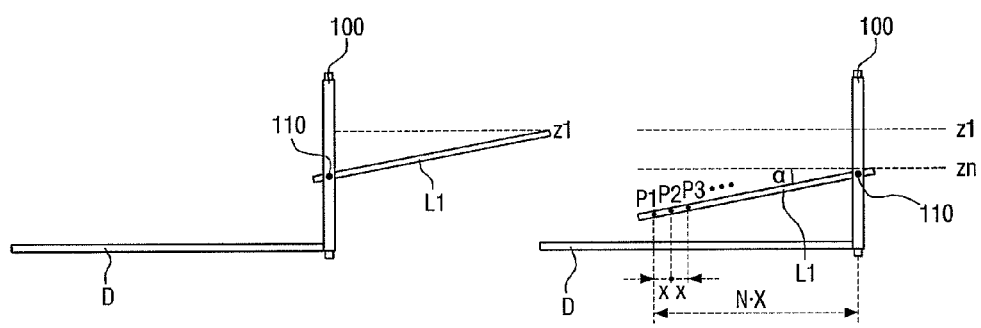
FIGS. 5 to 13 are diagrams for explaining the correction of the state of a substrate transporting loader of a substrate transporting apparatus according to an embodiment.

FIG. 5 illustrates side views of the frame 100 including the substrate transporting loader L1. A process of correcting the inclination of the substrate transporting loader L1 around the Y-axis will be described with reference to FIG. 5.

An operation of sensing the substrate transporting loader L1 is started, and the position sensed by the first light emitting sensor 110 and the first light receiving sensor 120 at a start point of the sensing operation is P1. In this case, a height Z1 may be detected by vertically moving the substrate transporting loader L1 in the Z-axis direction.

That is, in the case where the substrate transporting loader L1 enters a sensing region while being inclined by a first angle α around the Y-axis and a sensing operation is started, a value in the Z-axis direction may be referred to as Z1. Subsequently, in the case where the substrate transporting loader L1 moves in the X-axis direction (i.e., moves by a distance of N*X), a value in the Z-axis direction after the completion of the operation may be referred to as Zn.

The value Z1 and the value Zn are values that can be detected by vertically moving the substrate transporting loader L1 in the Z-axis direction.

In this case, the first angle α may be obtained by using the following Eq. 1. Based on the obtained information on the first angle α, the substrate transporting loader L1 may be corrected to maintain the horizontal state.

$$\alpha = (180/\pi) * \arctan\{(Z1-Zn)/(N*X)\}[-90° < \alpha < 90°] \quad \text{Eq. 1}$$

Figure 6:
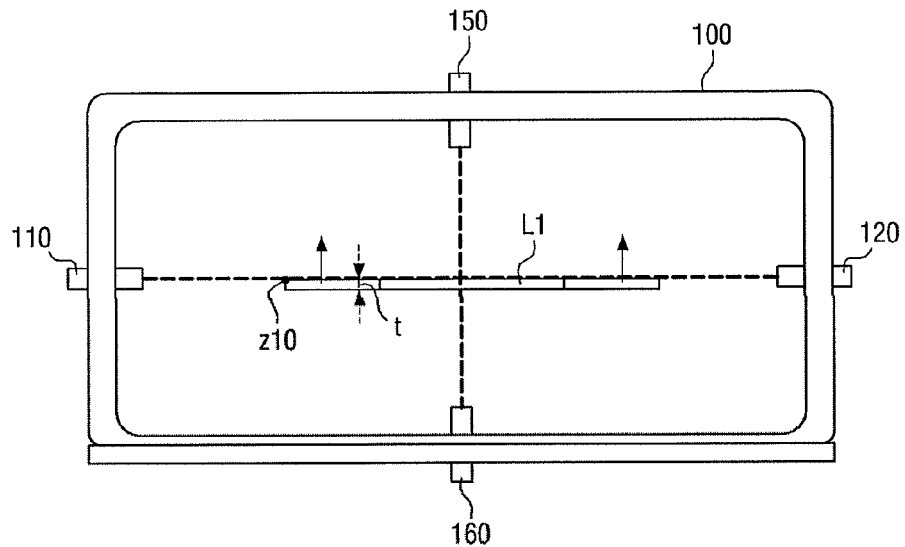
Figure 6:
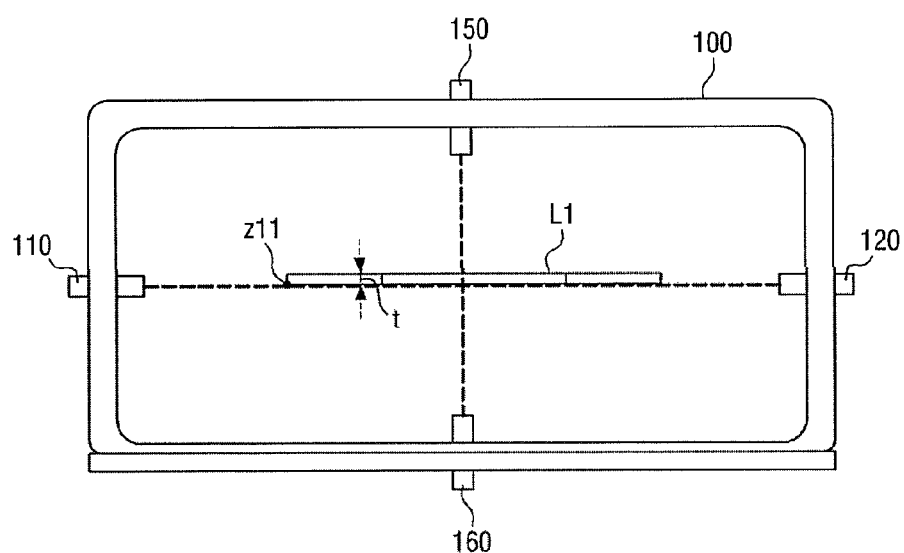
Figure 7:
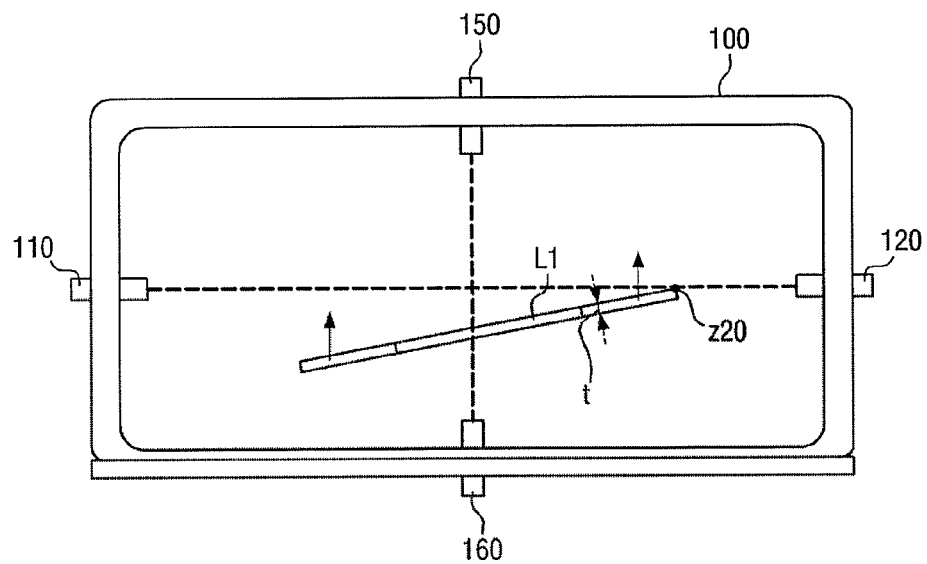
Figure 7:
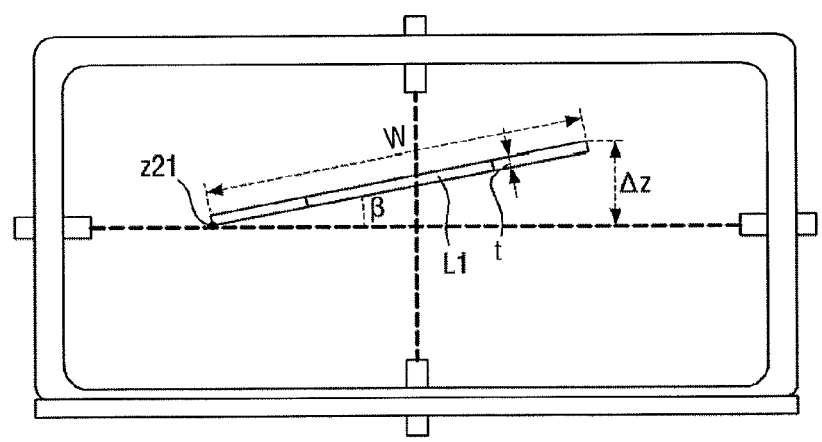

FIGS. 6 and 7 are front views of the frame 100 including the substrate transporting loader L1. A process of correcting the inclination of the substrate transporting loader L1 around the X-axis will be described with reference to FIGS. 6 and 7.

A sensing operation of the substrate transporting loader L1 is started, and the position sensed by the first light emitting sensor 110 and the first light receiving sensor 120 at a start point of the sensing operation is Z10.

Since FIG. 6 illustrates a case where the substrate transporting loader L1 ideally maintains the horizontal state, if the substrate transporting loader L1 moves up in the Z-axis direction, it is possible to know a thickness t of the substrate transporting loader L1.

That is, it is possible to obtain information on the thickness t of the substrate transporting loader L1 using information on a height Z10 at which the first sensing light SL1 begins to be blocked by the substrate transporting loader L1 and information on a height Z11 at which the first sensing light SL1 is unblocked again by the substrate transporting loader L1.

FIG. 7 illustrates a case where the substrate transporting loader L1 is inclined around the X-axis. Similarly, based on information on a height Z20 at which the first sensing light SL1 begins to be blocked by the substrate transporting loader L1 and information on a height Z21 at which the first sensing light SL1 is unblocked again by the substrate transporting loader L1, a second angle β can be obtained by using the following Eq. 2.

$$\beta = \arcsin\{(\Delta Z - t)/(W)\} \quad \text{Eq. 2}$$

By using the above-described information on the heights Z10, Z11, Z20 and Z21 and applying an offset value Z_offset, it is possible to obtain final height information on the target position T to be taught.

Figure 8:
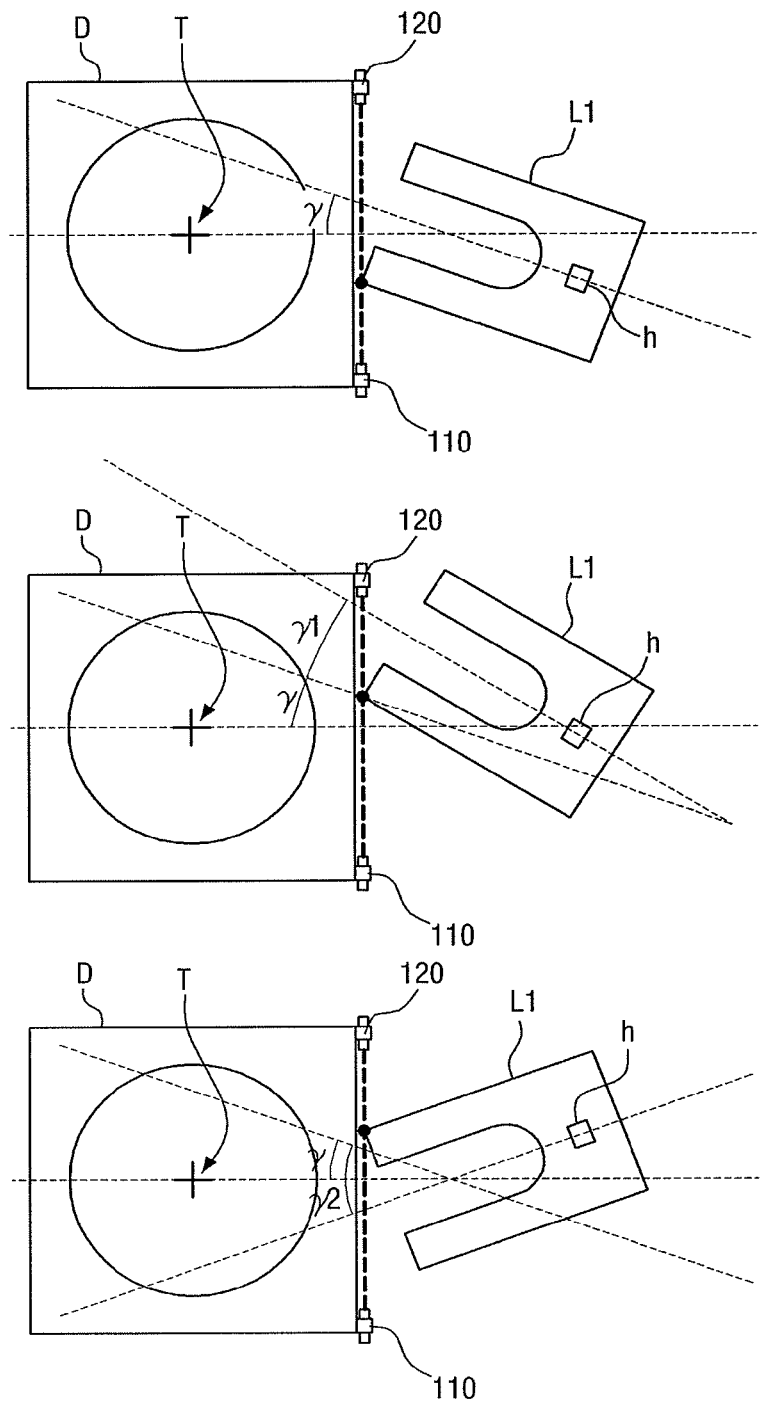

FIG. 8 illustrates plan views of the frame 100 including the substrate transporting loader L1. A process of correcting the inclination of the substrate transporting loader L1 around the Z-axis will be described with reference to FIG. 8.

The height of the substrate transporting loader L1 is adjusted based on a position at which the substrate transporting loader L1 blocks the first sensing light SL1. Subsequently, by moving the substrate transporting loader L1 forward/backward in the X-axis direction, a sensing operation is started at a position where the substrate transporting loader L1 begins to unblock the first sensing light SL1 in the X-axis direction.

When the sensing operation is performed in a state where the substrate transporting loader L1 is inclined by a third angle γ, a fourth angle γ1 and a fifth angle γ2 are measured by rotating the substrate transporting loader L1 in the Z-axis direction. In this case, a value θ is determined according to the following Eq. 3.

$$\theta = \gamma + (\gamma 2 - \gamma 1)/2 \quad \text{Eq. 3}$$

By applying an offset value θ_offset to the determined value θ, a final entry angle θ1 to be taught is determined (θ_offset is a predetermined value).

$$\theta 1 = \theta + \theta\_offset \quad \text{Eq. 4}$$

Figure 9:
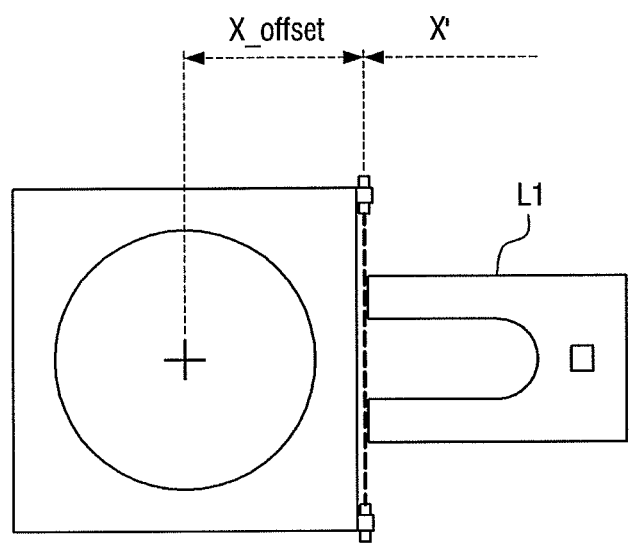

FIG. 9 is a plan view of the frame 100 including the substrate transporting loader L1. A process of determining a moving distance X_d of the substrate transporting loader L1 in the X-axis direction will be described with reference to FIG. 9.

FIG. 9 shows a method of determining the moving distance X_d using the first sensing light SL1. The moving distance X_d of the substrate transporting loader L1 in the X-axis direction may be determined by adding a predetermined offset value X_offset at a position X' of the tip of the substrate transporting loader L1. The position X' of the tip of the substrate transporting loader L1 means a position at which the first sensing light SL1 begins to be blocked by the substrate transporting loader L1.

FIGS. 10 to 13 are perspective views of the frame 100 including the substrate transporting loader L1. A process of determining the moving distance X_d of the substrate transporting loader L1 in the X-axis direction will be described with reference to FIGS. 10 to 13.

FIGS. 10 to 13 show a method of determining the moving distance X_d using the second sensing light SL2, and it is possible to know the position of the substrate transporting loader L1 using the sensing groove h formed in the substrate transporting loader L1. That is, by detecting a position at which the second sensing light SL2 traveling between the second light emitting sensor 150 and the second light receiving sensor 160 is blocked or unblocked by the substrate transporting loader L1, it is possible to determine the moving distance X_d of the substrate transporting loader L1 in the X-axis direction.

Figure 10:
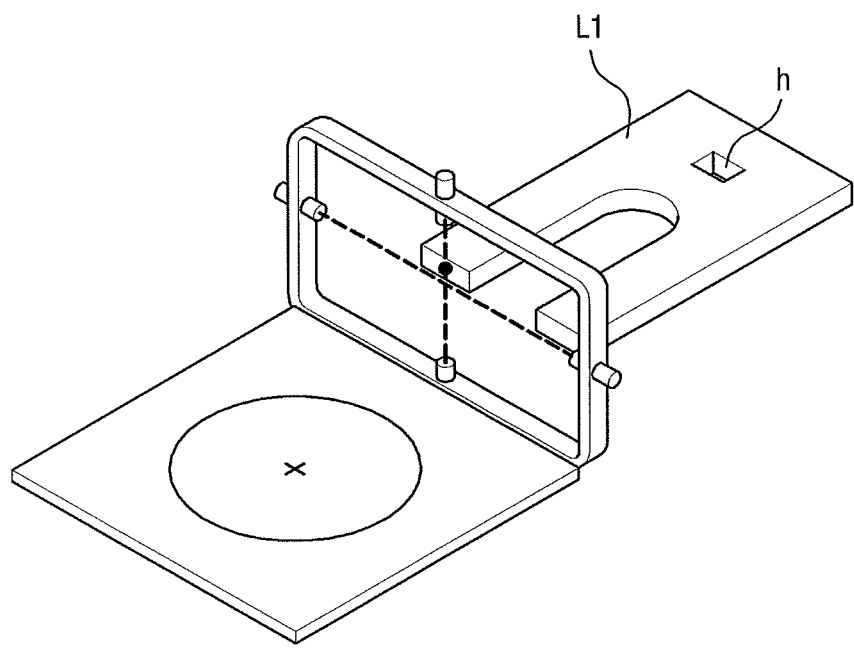
Figure 11:
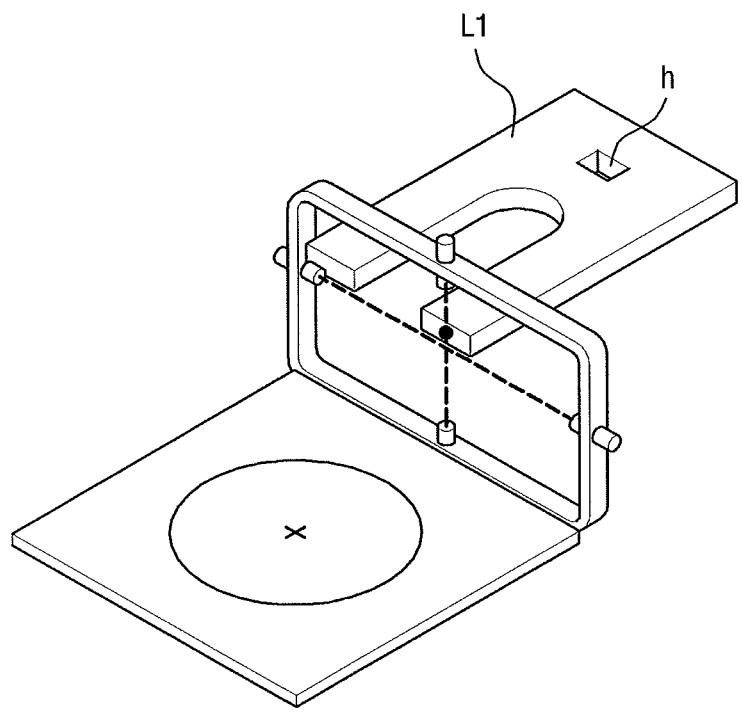
Figure 12:
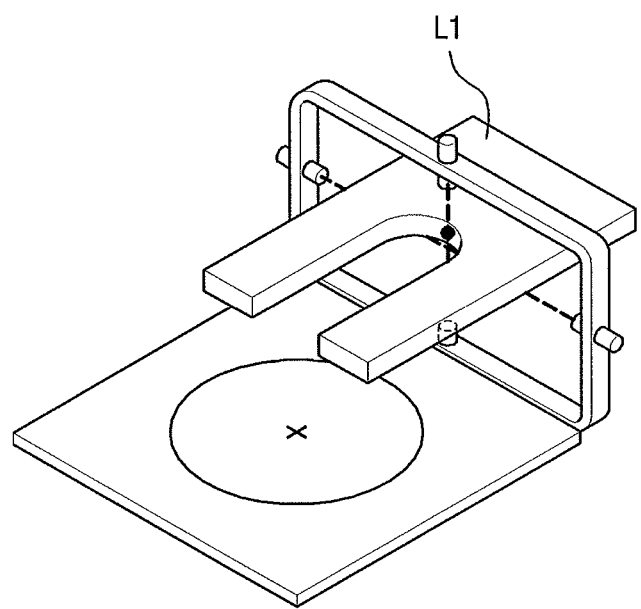
Figure 13:
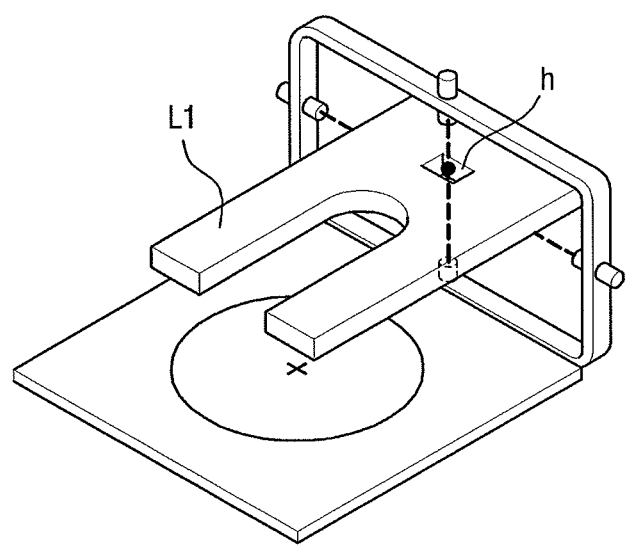

FIGS. 10 and 11 show a sensing example using the tip of the substrate transporting loader L1. FIG. 12 shows a sensing example using a circular portion of the substrate transporting loader L1. FIG. 13 is a sensing example using the sensing groove h of the substrate transporting loader L1.

Figure 14:
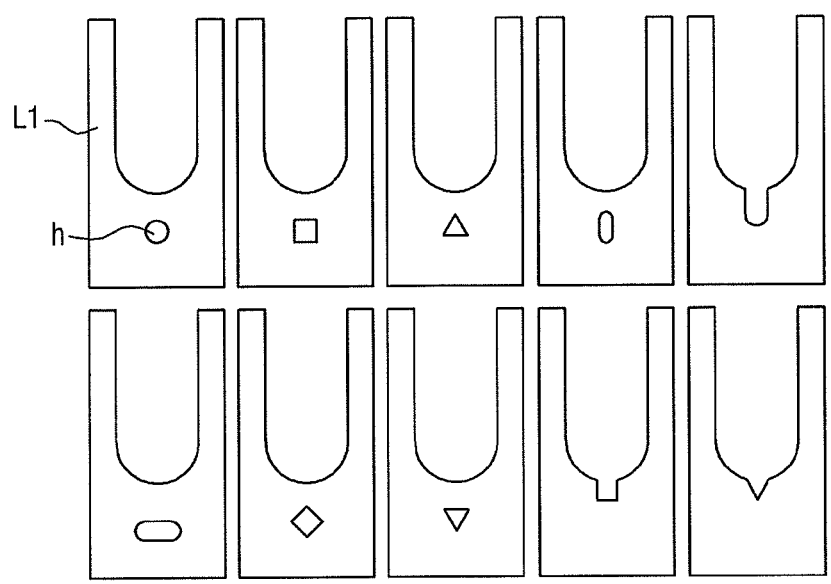
FIG. 14 exemplarily shows various embodiments of a substrate transporting loader.

FIG. 14 shows various exemplary embodiments of the substrate transporting loader. That is, as shown in FIG. 14, the sensing groove h formed in the substrate transporting loader L1 may have various shapes.

Figure 15:
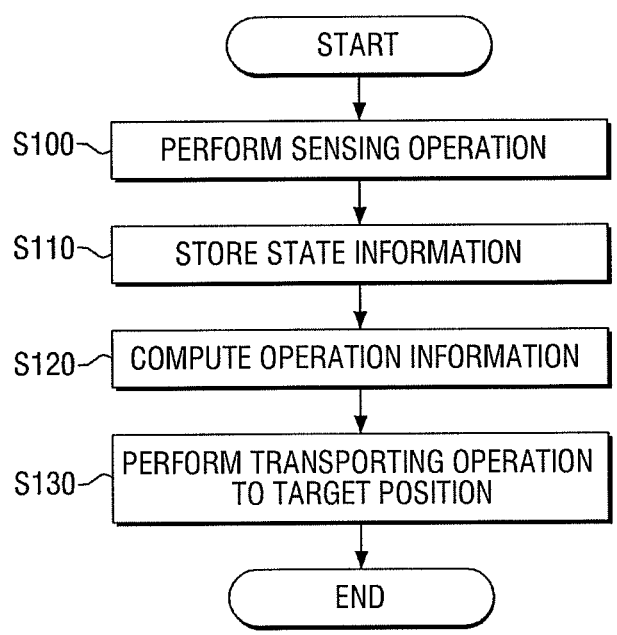
FIG. 15 is a flowchart showing sequential steps of a method of operating a substrate transporting apparatus according to an embodiment.

FIG. 15 is a flowchart showing the sequential steps of a method of operating the substrate transporting apparatus according to the embodiment.

Referring to FIG. 15, in the method of operating the substrate transporting apparatus according to the embodiment, first, a sensing operation is performed (step S100).

That is, the state information I_S of the substrate transporting loader L1 is obtained by using the first transmission type optical sensor and the second transmission type optical sensor. The state information I_S of the substrate transporting loader L1 includes the position information I_P and the inclination information I_I of the substrate transporting loader L1 as described above.

The first transmission type optical sensor emits the first sensing light SL1 in the horizontal direction with respect to the reference surface (e.g., upper surface of the substrate loading die D). The second transmission type optical sensor emits the second sensing light SL2 in the vertical direction with respect to the reference surface (e.g., upper surface of the substrate loading die D).

Then, the state information I_S may be stored in the state information storage unit 200 (step S110).

Subsequently, the operation information I_M of the substrate transporting loader L1 is computed based on the state information I_S (step S120). The operation information I_M of the substrate transporting loader L1 includes information for correcting the state of the substrate transporting loader L1 and moving the substrate transporting loader L1 to the target position T.

After correcting the state of the substrate transporting loader L1 based on the operation information I_M, an operation of moving the substrate transporting loader L1 to the target position T is performed (step S130).

Figure 16:
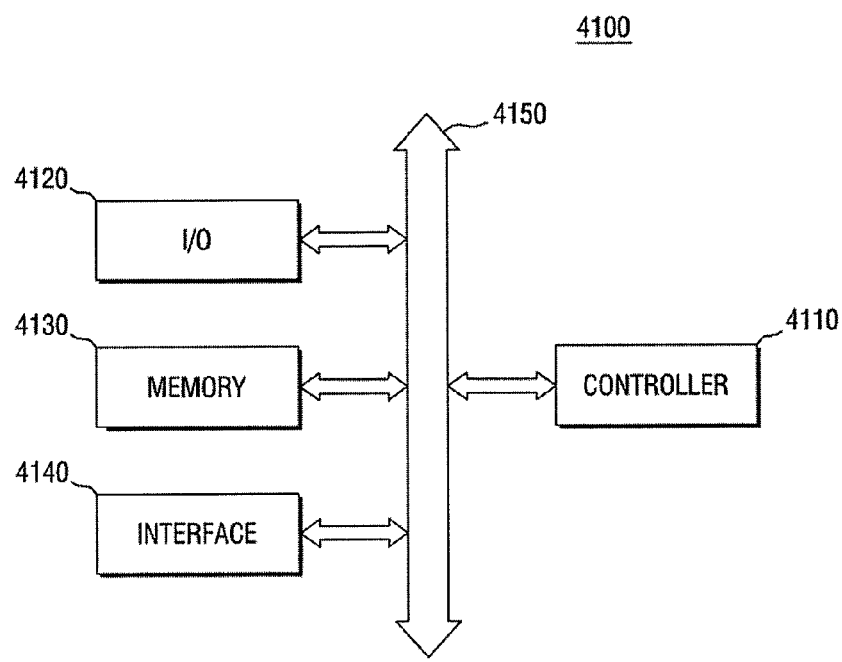
FIG. 16 is a block diagram of an electronic system including a semiconductor device formed by using a substrate transporting apparatus according to an embodiment.

FIG. 16 is a block diagram of an electronic system including a semiconductor device formed by using the substrate transporting apparatus according to an embodiment.

Referring to FIG. 16, an electronic system 4100 may include a controller 4110, an input/output (I/O) device 4120, a memory device 4130, an interface 4140, and a bus 4150.

The controller 4110, the I/O device 4120, the memory device 4130, and/or the interface 4140 may be connected to each other through the bus 4150. The bus 4150 corresponds to a path through which data are transmitted.

The controller 4110 may include at least one of a microprocessor, a digital signal processor, a micro-controller and other logic devices capable of performing functions similar to those thereof.

The I/O device 4120 may include a keypad, a keyboard and a display device and the like.

The memory device 4130 may store data and/or commands.

The interface 4140 may serve to transmit/receive data to/from a communication network. The interface 4140 may be of a wired or wireless type. For example, the interface 4140 may include an antenna or a wired/wireless transceiver or the like.

The electronic system 4100 may be applied to a personal digital assistant (PDA), a portable computer, a web tablet, a wireless phone, a mobile phone, a digital music player, a memory card, or various electronic products capable of transmitting and/or receiving information in a wireless environment.

Figure 17:
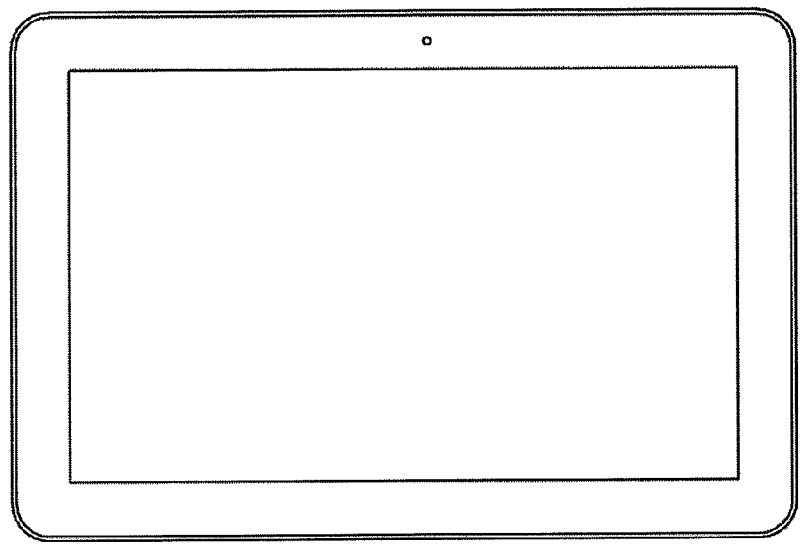
FIGS. 17 and 18 are exemplary semiconductor systems to which a semiconductor device formed by using a substrate transporting apparatus according to an embodiment may be applied.
Figure 18:
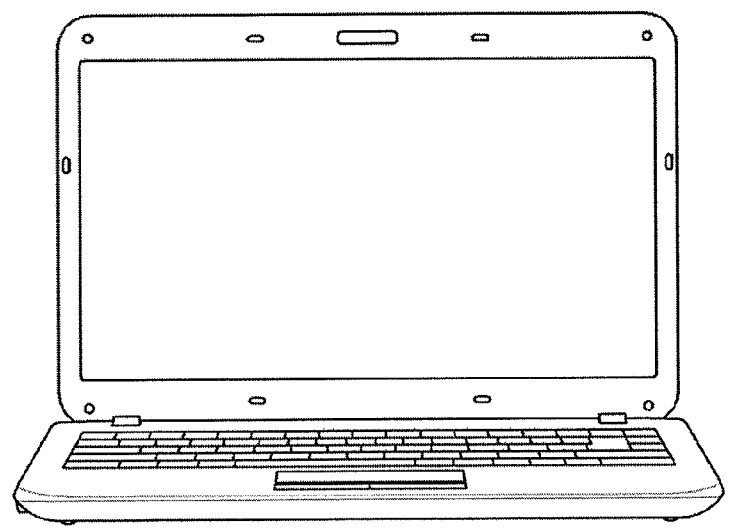

FIGS. 17 and 18 are exemplary semiconductor systems to which a semiconductor device formed by using the substrate transporting apparatus according to an embodiment may be applied. FIG. 17 shows a tablet PC, and FIG. 18 illustrates a laptop. At least one of the semiconductor devices formed by using the substrate transporting apparatus according to embodiments may be used in a tablet PC, a laptop and the like. It is obvious to those skilled in the art that the semiconductor device formed by using the substrate transporting apparatus according to the present invention may be applied to other integrated circuit devices which are not illustrated.

What is claimed is:

1. A substrate transporting apparatus, comprising:
a first emitting sensor to emit a first light in a first direction;
a first receiving sensor to receive the first light;
a second emitting sensor to emit a second light in a second direction different than the first direction;
a second receiving sensor to receive the second light, the first emitting and receiving sensors and the second emitting and receiving sensors being arranged to have a first virtual line connecting the first emitting and receiving sensors perpendicular to a second virtual line connecting the second emitting and receiving sensors;
a substrate transporting loader moveable through the first and second virtual lines to intersect the first light and the second light;
a frame on which the first and second emitting sensors and the first and second receiving sensors are arranged, the substrate transporting loader being moveable through an opening defined by the frame;

wherein:
the substrate transporting loader has a flat plate shape with a first edge of the flat plate shape facing the frame and being a first edge of the substrate transporting loader moveable through the opening defined by the frame,
the substrate transporting loader including a first opening and a sensing groove, the first opening extending from the first edge toward a second edge of the flat plate shape opposite the first edge, a longitudinal direction of the first opening being parallel to a longitudinal direction of the substrate transporting loader, and the sensing groove being between the first opening and the second edge of the flat plate shape, and
the second emitting sensor and the second receiving sensor obtaining position information of the substrate transporting loader by sensing a position of the sensing groove;
a state information storage to store state information of the substrate transporting loader; and
an operation information computing-processor to compute operation information of the substrate transporting loader based on the state information in the state information storage.

2. The substrate transporting apparatus of claim 1, further comprising an operation controller to control an operation of the substrate transporting loader based on the operation information computed by the operation information computing processor.

3. The substrate transporting apparatus of claim 1, wherein the frame has a continuous rectangular shape, the first and second emitting sensors and the first and second receiving sensors are arranged on different surfaces of the frame, respectively.

4. The substrate transporting apparatus of claim 3, wherein the first emitting sensor and the first receiving sensor are arranged on different surfaces of the frame facing each other along the first direction, and the second emitting sensor and the second receiving sensor are arranged on different surfaces of the frame facing each other along the second direction.

5. The substrate transporting apparatus of claim 1, wherein the sensing groove is separated from and completely spaced apart from the first opening.

6. The substrate transporting apparatus of claim 1, wherein the first light travels in a horizontal direction with respect to a reference surface, and the second light travels in a vertical direction with respect to the reference surface.

7. The substrate transporting apparatus of claim 1, wherein the state information includes position information or inclination information of the substrate transporting loader.

8. The substrate transporting apparatus of claim 7, wherein the position information includes information regarding a position of the substrate transporting loader in a three-dimensional orthogonal coordinate system.

9. The substrate transporting apparatus of claim 7, wherein the inclination information includes information regarding a degree by which the substrate transporting loader is rotated around an axis of a three-dimensional orthogonal coordinate system.

10. The substrate transporting apparatus of claim 1, wherein distances by which the first and second emitting sensors and the first and second receiving sensors are spaced apart from a target position are preset.

11. A substrate transporting apparatus, comprising:
first and second transmission type optical sensors to emit and receive first and second lights, the first and second lights being arranged to perpendicularity intersect each other;
a frame on which the first and second transmission type optical sensors are arranged; and
a substrate transporting loader located in a sensing region of the first and second transmission type optical sensors, the substrate transporting loader being moveable through an opening defined by the frame,
wherein:
the substrate transporting loader has a flat plate shape with a first edge of the flat plate shape facing the frame and being a first edge of the substrate transporting loader moveable through the opening defined by the frame,
the substrate transporting loader including a first opening and a sensing groove, the first opening extending from the first edge toward a second edge of the flat plate shape opposite the first edge, a longitudinal direction of the first opening being parallel to a longitudinal direction of the substrate transporting loader, and the sensing groove being between the first opening and the second edge of the flat plate shape;
wherein the first and second transmission type optical sensors to obtain position information and inclination information of the substrate transporting loader based on the first and second lights.

12. The substrate transporting apparatus of claim 11, wherein the first transmission type optical sensor emits the first light in a horizontal direction with respect to a reference surface, and the second transmission type optical sensor emits the second light in a vertical direction with respect to the reference surface.

13. The substrate transporting apparatus of claim 11, wherein the first and second transmission type optical sensors detect a point at which traveling of the first and second lights is blocked by the substrate transporting loader.

14. A method of operating a substrate transporting apparatus, the method comprising:
emitting a first light in a first direction using a first emitting sensor;
receiving the first light through a first receiving sensor;
emitting a second light in a second direction different than the first direction using a second emitting sensor;
receiving the second light through a second receiving sensor, the first emitting and receiving sensors and the second emitting and receiving sensors being arranged to have a first virtual line connecting the first emitting and receiving sensors perpendicular to a second virtual line connecting the second emitting and receiving sensors;
moving a substrate transporting loader through the first and second virtual lines to intersect the first light and the second light;
a frame on which the first and second emitting sensors and the first and second receiving sensors are arranged, the substrate transporting loader being moveable through an opening defined by the frame;
wherein:
the substrate transporting loader has a flat plate shape with a first edge of the flat plate shape facing the frame and being a first edge of the substrate transporting loader moveable through the opening defined by the frame,
the substrate transporting loader including a first opening and a sensing groove, the first opening extending from the first edge toward a second edge of the flat plate shape opposite the first edge, a longitudinal direction of the first opening being parallel to a longitudinal direction of the substrate transporting loader, and the sensing groove being between the first opening and the second edge of the flat plate shape, and
the second emitting sensor and the second receiving sensor obtaining position information of the substrate transporting loader by sensing a position of the sensing groove,
storing state information of the substrate transporting loader using a state information storage;
computing operation information of the substrate transporting loader based on the state information using an operation information computing processor; and
performing a transporting operation to a target position.

15. The method of claim 14, further comprising controlling an operation of the substrate transporting loader along three different directions based on the operation information using an operation controller.

16. The method of claim 14, further comprising arranging the first and second emitting sensors and the first and second receiving sensors on a frame.

17. The method of claim 16, wherein the frame has a rectangular shape, and the first and second emitting sensors and the first and second receiving sensors are arranged on different surfaces of the frame, respectively.

18. The method of claim 17, wherein the first emitting sensor and the first receiving sensor are arranged on surfaces facing each other, and the second emitting sensor and the second receiving sensor are arranged on surfaces facing each other.

* * * * *